United States Patent
van Ngo

(10) Patent No.: US 6,764,951 B1
(45) Date of Patent: Jul. 20, 2004

(54) METHOD FOR FORMING NITRIDE CAPPED CU LINES WITH REDUCED HILLOCK FORMATION

(75) Inventor: Minh van Ngo, Fremont, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 124 days.

(21) Appl. No.: 10/084,321

(22) Filed: Feb. 28, 2002

(51) Int. Cl.⁷ .............................................. H01L 21/44
(52) U.S. Cl. .................. 438/687; 438/937; 438/627; 438/628; 438/660
(58) Field of Search ................................ 438/687, 937

(56) References Cited

U.S. PATENT DOCUMENTS 4,476,150 A * 10/1984 Rose ........................... 427/10
4,549,064 A * 10/1985 Delfino ................... 219/121.65
6,153,523 A * 11/2000 Van Ngo et al. ............. 438/687

\* cited by examiner

*Primary Examiner*—John F. Niebling
*Assistant Examiner*—Angel Roman

(57) ABSTRACT

The electromigration resistance of nitride capped Cu lines is significantly improved by treating the exposed planarized surface of inlaid Cu with a plasma containing $NH_3$, depositing a silicon nitride capping layer at reduced temperatures, and then laser thermal annealing in $N_2$ to densify the silicon nitride capping layer. The resulting silicon nitride capping layer also exhibits improved barrier resistance to Cu migration and improved etch stop properties. Embodiments include Cu dual damascene structures formed in dielectric material dielectric constant (k) less than about 3.9.

15 Claims, 3 Drawing Sheets

US 6,764,951 B1

METHOD FOR FORMING NITRIDE CAPPED CU LINES WITH REDUCED HILLOCK FORMATION

TECHNICAL FIELD

The present invention relates to copper (Cu) and/or Cu alloy metallization in semiconductor devices, particularly to a method of forming reliably capped Cu or Cu alloy interconnects, such as single and dual damascene structures in low dielectric constant materials. The present invention is particularly applicable to manufacturing high speed integrated circuits having submicron design features and high conductivity interconnects with improved electromigration resistance.

BACKGROUND ART

The escalating requirements for high density demand responsive implementation techniques which have been found difficult to satisfy particularly in terms of providing a low R×C (resistance×capacitance) interconnect pattern with electromigration resistance. Conventional semiconductor devices comprise a semiconductor substrate, typically doped monocrystalline silicon, and a plurality of sequentially formed interlayer dielectrics and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometry's shrink to submicron levels.

A conductive plug filling a via hole is typically formed by depositing an interlayer dielectric on a conductive layer comprising at least one conductive pattern, forming an opening trough the interlayer dielectric by conventional photolithographic and etching techniques, and filling the opening with a conductive material, such as tungsten (W). Excess conductive material on the surface of the interlayer dielectric is typically removed by chemical mechanical polishing (CMP). One such method is known as damascene and basically involves forming an opening in the interlayer dielectric and filling the opening with a metal. Dual damascene techniques involve forming an opening comprising a lower contact or via hole section in communication with an upper trench section, which opening is filled with a conductive material, typically a metal, to simultaneously form a conductive plug in electrical contact with a conductive line.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. As the length of metal interconnects increases and cross-sectional areas and distances between interconnects decrease, the R×C delay caused by the interconnect wiring increases. If the interconnection node is routed over a considerable distance, e.g., hundreds of microns or more as in submicron technologies, the interconnection capacitance limits the circuit node capacitance loading and, hence, the circuit speed. As design rules are reduced to about 0.12 micron and below, the rejection rate due to integrated circuit speed delays significantly reduces production throughput and increases manufacturing costs. Moreover, as line widths decrease electrical conductivity and electromigration resistance become increasingly important.

Cu and Cu alloys have received considerable attention as a candidate for replacing Al in interconnect metallizations. Cu is relatively inexpensive, easy to process, and has a lower resistively than Al. In addition, Cu has improved electrical properties vis-à-vis W, making Cu a desirable metal for use as a conductive plug as well as conductive wiring.

An approach to forming Cu plugs and wiring comprises the use of damascene structures employing CMP. However, due to Cu diffusion through interdielectric layer materials, such as silicon dioxide, Cu interconnect structures must be encapsulated by a diffusion barrier layer. Typical diffusion barrier metals include tantalum (Ta), tantalum nitride (TaN), titanium nitride (TiN), titanium (Ti), titanium-tungsten (TiW), tungsten (W), tungsten nitride (WN), Ti—TiN, titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the dielectric interlayer, but includes interfaces with other metals as well.

There are additional problems attendant upon conventional Cu interconnect methodology employing a diffusion barrier layer (capping layer). For example, conventional practices comprise forming a damascene opening in an interlayer dielectric, depositing a barrier layer such as TaN, lining the opening and on the surface of the interlayer dielectric, filling the opening with Cu or a Cu alloy layer, CMP, and forming a capping layer on the exposed surface of the Cu or Cu alloy. It was found, however, that capping layers, such as silicon nitride, deposited by plasma enhanced chemical vapor deposition (PECVD), exhibit poor adhesion to the Cu or Cu alloy suit. Consequently, the capping layer is vulnerable to removal, as by peeling due to scratching or stresses resulting from subsequent deposition of layers. As a result, the Cu or Cu alloy is not entirely encapsulated and Cu diffusion occurs, thereby adversely affecting device performance and decreasing the electromigration resistance of the Cu or Cu alloy interconnect member.

In copending application Ser. No. 09/497,850 filed on Feb. 4, 2000, now U.S. Pat. No. 6,383,925, a method is disclosed comprising treating the surface of a Cu or Cu alloy layer with a plasma containing nitrogen ($N_2$) and ammonia ($NH_3$), followed by depositing the capping layer in the presence of $N_2$ in the same reaction chamber for improved adhesion of the capping layer. However after further experimentation and investigation, it was found that capped Cu or Cu alloy interconnects, as in damascene and dual damascene structures, exhibited poor electromigration resistance, particular in those cases wherein the exposed surface of the Cu or Cu alloy was treated with a plasma to remove a copper oxide surface film prior to deposition of the capping layer, e.g., silicon nitride. Such poor electromigration resistance adversely impacts device reliability and results in poor product yield.

In copending application Ser. No. 09/846,186 filed on May 2, 2001, now U.S. Pat. No. 6,506,677, a method of plasma treating an upper surface of inlaid Cu or Cu alloy metallization is disclosed using a relatively soft $NH_3$ plasma treatment heavily diluted with $N_2$, ramping up the introduction of silane ($SiH_4$) and then initiating plasma enhanced chemical vapor deposition (PECVD) while maintaining the same pressure during plasma treatment, $SiH_4$ ramp up and silicon nitride capping layer deposition, with an attendant significant improvement in electromigration resistance, within wafer uniformity and wafer-to-wafer uniformity.

Upon further experimentation and investigation of electromigration failures attendant upon interconnect technology in the deep sub-micron regime, it was found that hillocks are formed at the Cu/silicon nitride capping layer interface, thereby generating electromigration failures.

Accordingly, there exists a continuing need for methodology enabling the formation of encapsulated Cu and Cu alloy interconnects for vertical metallization levels with greater accuracy, reliability and electromigration resistance. There exists a particular continuing need for methodology enabling the formation of capped Cu or Cu alloy lines, particularly in damascene structures, e.g., dual damascene structures formed in dielectric material having a low dielectric constant (k), with improved reliability and electromigration resistance along the Cu/capping layer interfaces.

DISCLOSURE OF THE INVENTION

An advantage of the present invention is a method of manufacturing a semiconductor device having highly reliable capped Cu or Cu alloy interconnects.

Another advantage of the present invention is a method of manufacturing a semiconductor device comprising a silicon nitride capped Cu or Cu alloy interconnect member with reduced hillock formation and improved electromigration resistance along the Cu or Cu alloy/silicon nitride capping layer interface.

Additional advantages and other features of the present invention will be set forth in the description which follows and, in part, will become apparent to those having ordinary skill in the art upon examination of the following or may be learned from the practice of the sent invention. The advantages of the present invention may be realized and obtained as particularly pointed out in the appended claims.

According to the present invention, the foregoing and other advantages are achieved in part by a method of manufacturing a semiconductor device, the method comprising: forming a wafer containing inlaid copper (Cu) or a Cu alloy; treating an exposed surface of the Cu or Cu alloy to remove oxide therefrom; depositing a silicon nitride capping layer on the treated Cu or Cu alloy surface; and laser thermal annealing the deposited silicon nitride capping layer.

Embodiments of the present invention comprise treating the exposed surface of the Cu or Cu alloy with a plasma containing a ammonia ($NH_3$) at a temperature of about 250° C. to about 320° C., depositing the silicon nitride capping layer by plasma enhanced chemical vapor deposition (PECVD) at a temperature of about 250° C. to about 320° C. and then laser thermal annealing in nitrogen ($N_2$) at a temperature of about 420° C. to about 480° C. During laser thermal annealing, the as deposited density of the silicon nitride capping layer is increased by about 5% to about 8%, thereby enhancing its ability to serve as a barrier to Cu diffusion and enhancing its ability to function as an etch stop layer.

Embodiments of the present invention further include single and dual damascene techniques comprising forming an opening in an interlayer dielectric on a wafer, depositing an underlying diffusion barrier layer, such as Ta and/or TaN, lining the opening and on the interdielectric layer, depositing a seedlayer, depositing the Cu or a Cu alloy layer on the diffusion barrier layer filling the opening and over the interlayer dielectric, removing any portion of the Cu or Cu alloy layer beyond the opening by CMP, leaving an exposed surface oxidized, and conveying the wafer into the deposition chamber for processing in accordance with embodiments of the present invention by treating the exposed surface of the Cu or Cu alloy layer with a plasma containing $NH_3$, depositing the silicon nitride capping layer at reduced temperatures, and then laser thermal annealing by impinging a pulsed laser light beam on the as deposited silicon nitride capping layer to increase its density.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
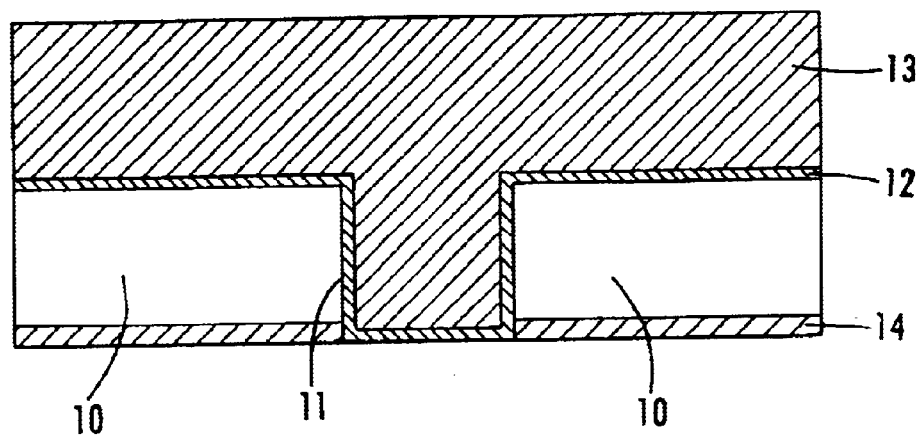
FIGS. 1–4 schematically illustrate sequential phases of a method in accordance with an embodiment of the present invention.

The present invention addresses and solves problems attendant upon forming capped Cu or Cu alloy interconnects, as with a capping layer of silicon nitride. Methodology in accordance with embodiments of the present invention enables a significant improvement in the adhesion of a capping layer, such as silicon nitride, to a Cu or Cu alloy interconnect member, thereby preventing capping layer peeling and preventing copper diffusion. In addition, embodiments of the present invention significantly reduce hillock formation, thereby significantly improving electromigration resistance at the Cu/nitride interface, and significantly improve within wafer and wafer-to-wafer uniformity. As employed throughout this application, the symbol Cu is intended to encompass high purity elemental copper as well as Cu-based alloys, such as Cu alloys containing minor amounts of tantalum, indium, tin, zinc, manganese, titanium, magnesium, chromium, titanium, germanium, strontium, platinum, magnesium, aluminum or zirconium.

As design rules are scaled down into the deep submicron range, such as about 0.12 micron and under, the electromigration resistance of encapsulated Cu interconnect members becomes increasingly significant It was found that conventional practices in forming a Cu interconnect member in a damascene opening, e.g., a dual damascene opening, result in the formation of a thin copper oxide surface film, believed to comprise a mixture of CuO and $Cu_2O$ formed during CMP. The thin copper oxide surface film layer is porous and brittle in nature. The presence of such a thin copper oxide surface film undesirably reduces the adhesion of a capping layer, such as silicon nitride, to the underlying Cu and/or Cu alloy interconnect member. Consequently, cracks are generated at the Cu or Cu alloy/copper oxide interface, resulting in copper diffusion and increased electromigration as a result of such diffusion. The cracks occurring in the Cu or Cu alloy/copper oxide interface enhance surface diffusion, which is more rapid than grain boundary diffusion or lattice diffusion.

In conducting methodology wherein copper oxide is removed from an exposed inlaid Cu metallization, as by treatment with a plasma containing $NH_3$, followed by deposition of the silicon nitride capping layer, the formation of hillocks at the interface between the inlaid Cu and silicon nitride capping layer becomes increasingly difficult to prevent as feature sizes were reduced into the deep submicron regime. For example, adverting to FIG. 5, damascene opening 51 formed in the dielectric layer 50, e.g., a low k material, is lined with a barrier layer 52 and filled with Cu metallization 53. Reference numeral 54 denotes a silicon nitride capping layer/etch stop layer employed during underlying interconnect processing. The inlaid Cu metallization 53 is initially processed by chemical mechanical polishing (CMP) and the exposed surfaces treated with a plasma containing $NH_3$ to remove copper oxide therefrom prior to depositing silicon nitride capping layer 55. Reference numeral 56 denotes an overlying dielectric layer which can also be a low k material. Disadvantageously, Cu hillocks 57 are frequently formed at the Cu/silicon nitride capping layer interface leading to electromigration and metal shorted failures. Such hillocks are believed to be attributed in part to the sensitized Cu surface processed by plasma treatment to remove copper oxide therefrom as well as conditions employed during silicon nitride capping layer deposition.

Figure 5:
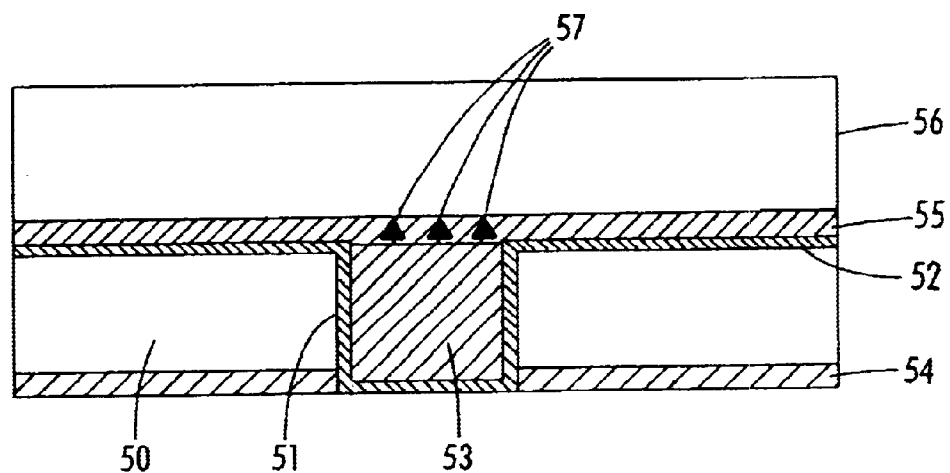
FIG. 5 illustrates a Cu damascene structure with hillock formation.

The present invention addresses and solves the electromigration problem of capped Cu lines in damascene structures, such as that illustrated in FIG. 5, by providing methodology enabling effective removal of copper oxide after CMP and application of a tightly adhered silicon nitride capping layer, and further enabling the formation of the silicon nitride capping layer having improved Cu diffusion barrier properties as well as improved etch stop capabilities. In accordance with embodiments of the present invention, plasma treatment of the exposed Cu surface as well as silicon nitride capping layer deposition are conducted at reduced temperatures. Embodiments of the present invention comprise treating the exposed Cu surface after CMP with a an $NH_3$ plasma at a temperature of about 250° C. to about 320° C., e.g., 300° C., and depositing the silicon nitride capping layer by PECVD at a temperature of about 250° C. to about 320° C., e.g., 300° C. It was found that by reducing the temperature during plasma treatment and during capping layer deposition, Cu hillock formation is suppressed. In addition, in accordance with embodiments of the present invention, the deposited silicon nitride capping layer is treated by laser thermal annealing to increase the as deposited density. Embodiments of the present invention comprise depositing the silicon nitride capping layer at a suitable thickness, such as about 460 Å to about 540 Å, e.g., about 500 Å, at and as deposited density of about 2.50 to about 2.60 $g/cm^3$. The deposited silicon nitride capping layer is then treated by laser thermal annealing at a temperature of about 420° C. to about 480° C., in $N_2$ at a suitable flow rate, such as about 200 to about 500 sccm.

In implementing embodiments of the present invention, optimum parameters can be determined for particular situation. For example, it was generally found suitable to conduct laser thermal annealing by impinging a pulsed laser light beam on the deposited silicon nitride for about 10 to about 100 nanoseconds at a radiant fluence of about 0.114 to about 0.130 joules/$cm^2$, thereby elevating its temperature to about 420° C. to about 480° C. It was found that laser thermal annealing advantageously enables pinpoint accuracy in heating the silicon nitride capping layer without heating other areas of the wafer, thereby avoiding various problems such as dopant diffusion. During laser thermal annealing, the density of the deposited silicon nitride layer is increased by about 5% to about 8%, e.g., by about 5%, as to a density to about 2.67 to about 2.77 $g/cm^3$. Such an increased density not only reduces diffusion paths at the Cu/silicon nitride capping layer interface but also improves resistance of the silicon nitride capping layer to Cu diffusion and improves the ability of the silicon nitride capping layer to function as an etch stop layer during subsequent processing.

In accordance with an embodiment of the present invention, a wafer containing inlaid Cu having an exposed surface with a copper oxide film believed to be generated by CMP is introduced into a deposition chamber. An $NH_3$ flow rate of about 210 to about 310 sccm, e.g., about 260 sccm, is established A pressure of about 3 to about 5 Torr and temperature of about 300° C. is also established. A plasma is then initiated, as after about 5 to about 25 seconds, typically about 15 seconds, by applying an RF power of about 50 watts to about 200 watts, and the exposed surface of the in-laid Cu is treated with an $NH_3$ plasma to reduce the copper oxide film, typically for about 5 to about 40 seconds, e.g., about 5 to about 25 seconds.

In accordance with an embodiment of the present invention, the silicon nitride capping layer is deposited by PECVD. Suitable or optimum PECVD conditions can be determined in a particular situation. For example, it was found suitable to deposit the silicon nitride capping layer at an RF power of about 400 to about 500 watts, e.g., about 450 watts, a spacing between the exposed surface and shower head through which the gases are ejected of about 680 to about 720 mils, e.g., about 700 mils.; a silane ($SiH_4$) flow rate of about 132 to about 170 sccm, e.g., about 150 sccm; a $NH_3$ flow rate of about 250 to about 310 sccm, e.g., about 280 sccm, a $N_2$ flow rate of about 8,000 to about 9,200 sccm, e.g., about 8,600 sccm, and the temperature of about 250° C. to about 320° C., e.g., about 300° C.

In implementing a laser thermal annealing in accordance with embodiments of the present invention, conventional laser equipment can be employed, such as an Excimer or Nd-YAG pulsed laser. Conventional laser sources, such as the Verdant Technologies laser anneal tool operating at an exposure wavelength of 308 nm can be employed. Other suitable laser sources capable of operating at a suitable energy, e.g., about 10 to about 2,000 $mJ/cm^2$/pulse, e.g., about 100 to about 400 $mJ/cm^2$/pulse can also be employed.

The present invention addresses and solves the problem of surface contamination and surface reaction of inlaid Cu metallization after plasma treatment, as with an $NH_3$-containing plasma, thereby significantly improving the integrity of the interface between the Cu interconnect and capping layer, e.g., silicon nitride capping layer. Moreover, the present invention significantly reduces the formation of hillocks, thereby further reducing electromigration failures, and significantly improves within wafer and wafer-to-wafer uniformity. The present invention further reduces electromigration at the Cu/silicon nitride interface by implementing laser thermal annealing to increase the density of the silicon nitride capping layer which also improves its ability to function as a barrier layer and as an etch stop layer. Accordingly, the present invention enables a significant increase in device reliability, particularly in the sub-micron regime.

Embodiments of the present invention include slowly introducing $SiH_4$ into the chamber, after plasma treatment of the Cu surface to remove copper oxide. The $SiH_4$ flow rate is ramped up to a suitable deposition flow rate, as in a plurality of stages. For example, $SiH_4$ can be introduced during a first stage until a flow rate of about 70 to about 90 sccm is achieved, typically over a period of about 2 to about 5 seconds, and subsequently ramped up to a suitable deposition flow rate of about 130 to about 170 sccm, typically over a period of about 3 to about 8 seconds. Deposition of the silicon nitride capping layer is then initiated by striking a plasma.

The mechanism underpinning the significant reduction in electromigration along the Cu/silicon nitride capping layer interface achieved by embodiments of the present invention is not known with certainty. However, it is believed that by conducting plasma treatment at a reduced temperature, the treated Cu surface exhibits reduced sensitivity vis-a-vis plasma treatment at higher temperatures. In addition, by conducting silicon nitride deposition at a reduced temperature, the plasma treated Cu surface is not subjected to the degree of aggression which would occur or elevated temperatures. It is, therefore, believed that by reducing the temperature during plasma treatment and during silicon nitride capping layer deposition, the formation of hillocks is significantly reduced. Moreover, by conducting laser thermal annealing to increase the density of the deposited silicon nitride capping layer, the silicon-nitrogen bonding is improved, thereby significantly reducing diffusion along the Cu/silicon nitride capping layer interface. In addition, the silicon nitride capping layer having an increased density exhibits improved Cu barrier properties and superior etch stop characteristics.

Improved electromigration resistance of capped Cu interconnects formed in accordance with embodiments of the present invention was confirmed by lognormal sigma measurements. Lognormal sigma is a measure of spread in electromigration (EM) data (failure times). Higher sigma leads to a lower projected EM lifetime at use conditions. The product EM lifetime is calculated by the following eqn: Lifetime=T50% $exp(-N^6$ sigma) where T50% is Median time to fail (MTTF) and N=6 for T0.1% failure rate and product factor of about $10^6$. Therefore, higher values of sigma could cause a significant degradation in projected lifetime due to the exponential dependence. The inventive process flow disclosed herein not only improves T50% but also give a tight sigma, which leads to higher projected DM lifetime.

Cu interconnects formed in accordance with embodiments of the present invention can be, but are not limited to, interconnects formed by damascene technology. Thus, embodiments of the present invention include forming an interlayer dielectric overlying a substrate, forming an opening, e.g., a damascene opening, in the interlayer dielectric, depositing a diffusion barrier layer, such as Ta and/or TaN, and filling the opening with Cu. Advantageously, the opening in the interlayer dielectric can be filled by initially depositing a seed layer and then electroplating or electrolessly plating the Cu. Typical seed-layers include Cu alloys containing magnesium, aluminum, zinc, zirconium, tin, nickel, palladium, silver or gold in a suitable amount, e.g., about 0.3 to about 12 at. %. CMP is then performed such that the upper surface of the inlaid Cu is substantially coplanar with the upper surface of the interlayer dielectric. As a result of CMP, a thin film of copper oxide is typically formed. The exposed oxidized surface of the Cu is then processed in accordance with an embodiment of the present invention, thereby substantially eliminating or significantly reducing surface contamination and surface reaction and, hence, significantly reducing electromigration failures.

In accordance with embodiments of the present invention, the damascene opening can also be filled with Cu by PVD at a temperature of about 50° C. to about 150° C. or by CVD at a temperature under about 200° C. In various embodiments of the present invention, conventional substrates and interlayer dielectrics, can be employed. For example, the substrate can be doped monocrystalline silicon or gallium-arsenide. The interlayer dielectric employed in the present invention can comprise any dielectric material conventionally employed in the manufacture of semiconductor devices. For example, dielectric materials such as silicon dioxide, phosphorous-doped silicate-glass (PSG), boron-and phosphorus doped silicate glass (BPSG), and silicon dioxide derived from tetraethylorthosilicate (TEOS) or silane by PECVD can be employed. The openings formed in dielectric layers are effected by conventional photolithographic and etching techniques.

Advantageously, dielectric materials for use as interlayer dielectrics in accordance with embodiments of the present invention can comprise dielectric materials with lower values of permitivity and those mentioned above, in order to reduce interconnect capacitance. The expression "low-k" material has evolved characterized materials with a dielectric constant less than about 3.9, e.g., about 3.5 or less. The value of a dielectric constant expressed herein is based upon the value of (1) for a vacuum.

A wide variety of low-k materials can be employed in accordance with embodiments of the present invention, both organic and inorganic. Suitable organic materials include various polyimides and BCB. Other suitable low-k dielectrics include poly(arylene)ethers, poly(arylene)ether azoles, parylene-N, polyimides, polynapthalene-N, polyphenylquinoxalines (PPQ), polyphenyleneoxide, polyethylene and polypropylene. Other low-k materials suitable for use in embodiments of the present invention include $FO_x$™ (HSQ-based), XLK™ (HSQ-based), and porous SILK™, an aromatic hydrocarbon polymer (each available from Dow Chemical Co., Midland, Mich.); Coral™, a carbon-doped silicon oxide (available from Novellus Systems, San Jose, Calif.), silicon-carbon-oxygen-hydrogen (SiCOH) organic dielectrics, Black-Diamond™ dielectrics, Flare™, an organic polymer, HOSP™, a hybrid sioloxane-organic polymer, and Nanoglass™, a nanoporous silica (each available from Honeywell Electronic Materials) and halogen-doped (e.g., fluorine-doped) silicon dioxide derived from tetraethyl orthosilicate (TEOS) and fluorine-doped silicate glass (FSG).

An embodiment of the present invention is schematically illustrated in FIGS. 1–4, wherein similar reference numerals denote similar elements or features. Adverting to FIG. 1, damascene opening 11, such as a contact or via hole, is formed in dielectric layer 10, e.g., a low-k material. It should be understood that opening 11 can also be formed as a dual damascene opening comprising a contact or via hole section in communication with a trench section. A barrier layer 12 is deposited, such as Ta and/or TaN, and Cu layer 13 is then deposited. Upon electroplating or electroless plating layer 13, a seed layer (not shown) is deposited on barrier layer 12. Reference numeral 14 denotes a lower silicon nitride capping layer/etch stop layer.

Figure 2:
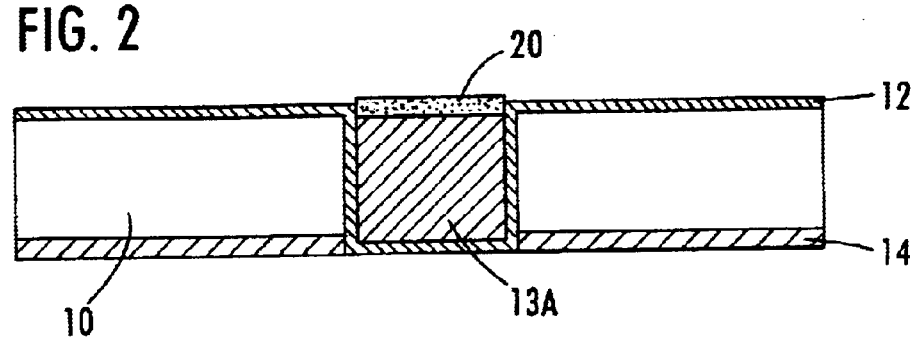

Adverting to FIG. 2, the portions of the Cu alloy layer 13 extending beyond opening 11 are removed, as by CMP. As a result, a thin film of copper oxide 20 is formed on the exposed surface of the Cu interconnect member 13A. The wafer containing the Cu metallization is then introduced into deposition chamber and processed in accordance with embodiments of the present invention.

Figure 3:
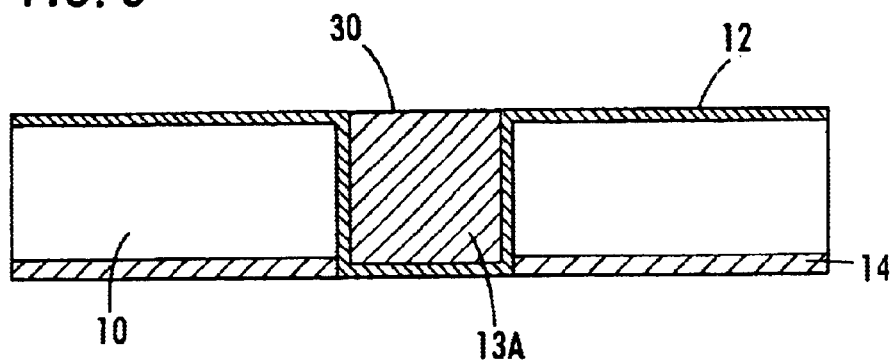

Adverting to FIG. 3, in accordance with embodiments of the present invention, the exposed surface of the Cu interconnect member 13A having a thin copper oxide film 20 thereon is treated with a plasma containing $NH_3$ at a reduced temperature, e.g., about 300° C., to remove or substantially reduce the thin copper oxide film 20 leaving a clean Cu surface 30 which exhibits reduced sensitivity vis-à-vis Cu surfaces that are plasma treated at higher temperatures, e.g., between 300° C. and 400° C.

Figure 4:
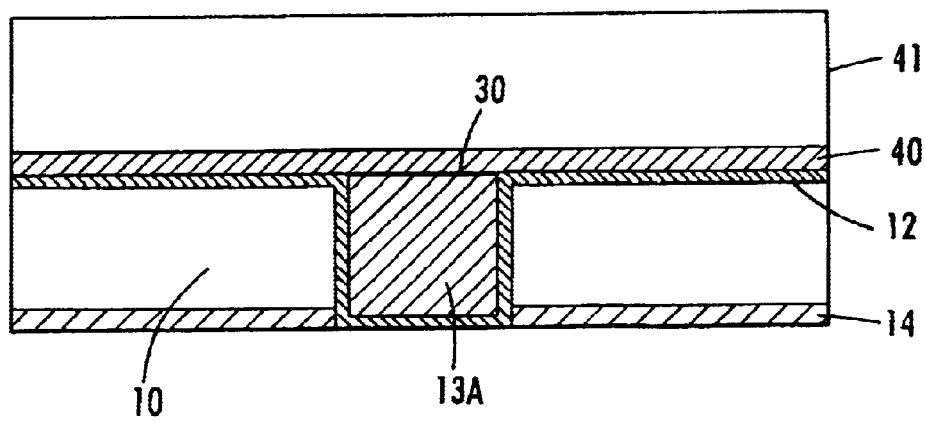

As shown in FIG. 4, the flow rate of $SiH_4$ is ramped up and a plasma is generated to deposit silicon nitride capping layer 40 at a reduced temperature of about 300° C., on the cleaned exposed surface 30 of Cu interconnect 13A. The deposited silicon nitride capping layer exhibits an as deposited density of about 2.50 to about 2.60. Laser thermal annealing is then conducted employing an $NH_3$ flow rate of about 200 to about 5,000 sccm, as by impinging a pulsed laser light beam to elevate the temperature of the deposited silicon nitride to about 420° C. to about 480° C. During such laser thermal annealing, the density of the silicon nitride capping layer 40 is increased by about 5% to about 8%, as to a density of about 2.67 to about 2.77 g/cm³. Another interlayer dielectric 41 is then deposited, such as a low-k material. In this way, a plurality of interlayer dielectrics and metallization patterns are built up on a semiconductor substrate and various interconnects are formed.

The present invention enables the formation of extremely reliable capped Cu and/or Cu alloy interconnect members by significantly reducing electromigration failures stemming from diffusion along the Cu/silicon nitride interface. In addition, the inventive methodology significantly reduces surface-contamination and reaction products at the interface between a plasma treated copper surface and silicon nitride capping layer deposited thereon, thereby enhancing the adhesion of the capping layer and reducing electromigration failures. In addition, the present invention enables a significant reduction in hillock formation and, hence, a significant increase in electromigration resistance. The laser thermal annealed silicon nitride capping layers also exhibit enhanced Cu barrier layer and etch stop capabilities. Consequently, the present invention advantageously reduces capping layer peeling, reduces copper diffusion, enhances electromigration resistance, improves device reliability, improves within wafer and wafer-to-wafer uniformity, increases production throughput and reduces manufacturing costs.

The present invention enjoys industrial applicability in the formation of various types of inlaid Cu metallization interconnection patterns. The present invention is particularly applicable to manufacturing semiconductor devices having submicron features and high aspect ratio openings.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present invention. It is to be understood that the present invention is capable of use in various other combinations and environments and is capable of changes or modifications within the scope of the inventive concept as expressed herein.

What is claimed is:

1. A method of manufacturing a semiconductor device, the method comprising:
   forming a wafer containing inlaid copper (Cu) or a Cu alloy;
   treating an exposed surface of the Cu or Cu alloy to remove oxide therefrom;
   depositing a silicon nitride capping layer on the treated Cu or Cu alloy; and
   laser thermal annealing the deposited silicon nitride capping layer.

2. The method according to claim 1, comprising treating the exposed surface of the Cu or Cu alloy with a plasma containing ammonia ($NH_3$) at a temperature of about 250° C. to about 320° C. to remove copper oxide therefrom.

3. The method according to claim 2, comprising depositing the silicon nitride capping layer by plasma enhanced chemical vapor deposition (PECVD) at a temperature of about 250° C. to about 320° C.

4. The method according to claim 3, comprising laser thermal annealing the deposited silicon nitride capping layer in nitrogen $N_2$) at a temperature of about 420° C. to about 480° C.

5. The method according to claim 4, comprising:
   depositing the silicon nitride capping layer at an as deposited first density; and
   laser thermal annealing the deposited silicon nitride capping layer to increase its density to a second density greater then the first density.

6. The method according to claim 5, comprising laser thermal annealing the deposited silicon nitride capping layer to increase the first density by about 5% to about 8%.

7. The method according to claim 6, comprising laser thermal annealing the deposited silicon nitride capping layer to increase its density to the second density of about 2.67 to about 2.77 g/cm³.

8. The method according to claim 4, comprising laser thermal annealing by impinging a pulsed laser light beam on the deposited silicon nitride capping layer at a radiant fluence of about 0.114 to about 0.130 joules/cm².

9. The method according to claim 1, comprising laser thermal anneal the deposited silicon nitride capping layer in nitrogen ($N_2$) at a temperature of about 420° C. to about 480° C.

10. The method according to claim 1, comprising:
    depositing the silicon nitride capping layer at an as deposited first density; and
    laser thermal annealing the deposited silicon nitride capping layer to increase its density to a second density greater than the first density.

11. The method according to claim 10, comprising laser thermal annealing the deposited silicon nitride capping layer to increase its density to the second density of about 5% to about 8% greater than the first density.

12. The method according to claim 11, comprising laser thermal annealing the deposited silicon nitride capping layer to increase its density to the second density of about 2.67 to about 2.77 g/cm³.

13. The method according to claim 1, comprising a laser thermal annealing by impinging a pulsed laser light beam on the deposited silicon nitride capping layer at a radiant fluence of about 0.114 to about 0.130 joules/cm².

14. The method according to claim 1, wherein:
the wafer contains a dual damascene structure comprising a Cu or Cu alloy line in contact with an underlying Cu or Cu alloy via or contact formed in a dielectric layer; and the dielectric layer comprises a material having a dielectric constant less than about 3.9.

15. A method of manufacturing a semiconductor device, the method comprising:

forming a wafer containing inlaid copper (Cu) or a Cu alloy;

treating an exposed surface of the Cu or Cu alloy to remove oxide therefrom;

depositing a silicon nitride capping layer on the treated Cu or Cu alloy;

by plasma enhanced chemical vapor deposition (PECVD) at a temperature of about 250° C. to about 320° C., and laser thermal annealing the deposited silicon nitride capping layer.

* * * * *